(12) United States Patent
Sridhar et al.

(10) Patent No.: US 7,393,758 B2
(45) Date of Patent: Jul. 1, 2008

(54) WAFER LEVEL PACKAGING PROCESS

(75) Inventors: Uppili Sridhar, Dallas, TX (US); Quanbo Zou, Plano, TX (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 151 days.

(21) Appl. No.: 11/265,810

(22) Filed: Nov. 3, 2005

(65) Prior Publication Data

US 2007/0099395 A1    May 3, 2007

(51) Int. Cl.
*H01L 21/46* (2006.01)
*H01L 21/78* (2006.01)
*H01L 21/301* (2006.01)

(52) U.S. Cl. .............................. 438/460; 257/684; 450/3
(58) Field of Classification Search ................... 438/51, 438/55, 126, 460; 257/684, 704; 450/3, 450/24, 25, 63
See application file for complete search history.

(56) References Cited

U.S. PATENT DOCUMENTS

| | | | |
|---|---|---|---|
| 6,225,145 B1 | 5/2001 | Choi et al. | |
| 6,384,353 B1 | 5/2002 | Huang et al. | |
| 6,429,511 B2 | 8/2002 | Ruby et al. | |
| 6,528,344 B2 | 3/2003 | Kang | |
| 6,624,505 B2 | 9/2003 | Badehi | |
| 6,777,263 B1 | 8/2004 | Gan et al. | |
| 7,204,737 B2 * | 4/2007 | Ding et al. | 445/24 |
| 2002/0113321 A1 | 8/2002 | Siniaguine | |
| 2004/0087043 A1 | 5/2004 | Lee et al. | |

FOREIGN PATENT DOCUMENTS

| | | |
|---|---|---|
| EP | 1 071 126 A2 | 1/2001 |
| WO | WO-03/024865 A2 | 3/2003 |
| WO | WO-2005/006432 A2 | 1/2005 |

OTHER PUBLICATIONS

Fujii, M. et al., "Micro Machined Relay with Vertical Feed Through and Wirebound-Less Package", pp. 16-1 to 16-4, Omron Corporation, Ibaraki, Japan.
Fujii, M. et al., "RF MEMS Switch with Wafer Level Package Utilizing Frit Glass Bonding", Omron Corporation, Micromaching Lab, Central R&D Lab, Ibaraki, Japan.

(Continued)

*Primary Examiner*—Phuc T. Dang
(74) *Attorney, Agent, or Firm*—Blakely Sokoloff Taylor & Zafman LLP

(57) ABSTRACT

Wafer level packaging process for packaging MEMS or other devices. In some embodiments, a MEMS wafer with normal thickness is firstly bonded to a cap wafer of normal thickness, followed by a thinning on the backside of the MEMS wafer. After this, the bonded wafer stack and the capping of the hermetically packaged MEMS devices are still rigid enough to do further processing. On this basis, through vias on the thinned substrate can be easily formed and stopped on the regions to be led out (e.g., metal pads/electrodes, highly doped silicon, etc.). Vias can be partially filled as this is the final surface of process. Even thick metal coated/patterned vias have much more space to relax possible thermal stress, as long as the vias are not completely filled with hard metal(s). Various embodiments are disclosed.

29 Claims, 7 Drawing Sheets

OTHER PUBLICATIONS

Esashi, Masayoshi et al., "Packaged Micromechanical Sensors", 1994 IEEE Symposium on Emerging Technologies & Factory Automation, pp. 30-37.

Teomim, Doron et al. "An innovative approach to wafer-level MEMS packaging", Solid State Technology, Jan. 2002.

Li, Xinghua et al., "Fabrication of High-Density Electrical Feed-Throughs by Deep-Reactive-Ion Etching of Pyrex Glass", Journal of Microelectromechanical Systems, Dec. 2002, vol. 11, No. 6, pp. 625-630.

* cited by examiner

WAFER LEVEL PACKAGING PROCESS

BACKGROUND OF THE INVENTION

1. Field of the Invention

The present invention relates to the field of wafer level packaging.

2. Prior Art

Wafer level packaging of micro-electro-mechanical system (MEMS) devices has been an attractive and challenging topic in recent years. A hermetic package can greatly improve the device performance and reliability. Consequently, hermetic bonding is highly preferred in many MEMS devices. Bonding techniques used in the field have included adhesives/polymer/epoxy bond (which are not hermetic bonds), solder eutectic bonds, Si/metal eutectic bonds, metal-metal thermal compression bonds, glass frit bonds, anodic bonds, etc.

A common way of providing electrical lead-outs is through lateral feed-through lines to the edge of the die, which is then sealed by a cap wafer bonded over the die. The feed-through lines crossing the bond rim usually don't allow a metal-related bond. Instead, a dielectric-bond is necessary in this arrangement. However, this lateral lead-out has relatively long feed-through lines, which leads to large parasitic capacitances, cross-talk and substantial interconnection resistances. This technique also precludes any wafer level bumping process.

In order to solve the above-mentioned issues, wafer-level-packages with vertical feed-throughs have been disclosed. Via forming, metal(s) filling and both side metallization are done on a separate single dielectric wafer, such as glass or ceramic. This wafer bonded to a MEMS wafer completes the wafer process, or alternatively, this wafer is just a base material on top of which MEMS devices are built. U.S. Pat. No. 6,384,353 also discloses a method of building a MEMS device on a substrate with filled vias and metallization on both sides, though little processing is described. For reasonably large format wafer processes (e.g., 4-inch or 6-inch above), a wafer with vias calls for substrate rigidity (i.e., wafer thickness) that increases the difficulty/cost of the via process, and also leads to high parasitic coupling capacitances.

In one case, through holes as vertical feed-through paths are firstly formed in a glass wafer. Then the glass wafer is bonded to a MEMS silicon wafer by anodic bonding to form a hermetic package, while the metal pads on the silicon substrate are aligned to the glass vias and thus exposed. The exposed pads allow a further metallization process on the outer surface of the glass wafer to complete the interconnection. Another approach is to fill up the glass vias with metal(s) electro-plated studs and metallization on the glass surface, followed by the anodic bonding to the MEMS wafer to complete the whole process.

Another approach has adopted a combined metallized glass via and lateral feed-through process using glass frit bonding. This process starts the glass wafer with via forming before bonding to another substrate, hence the rigidity of the glass wafer becomes a problem. Normally thin glass of around 150 um thick is used in a small wafer format (e.g., no more than 3-inch), as forming through vias on a thicker wafer will tremendously increase the process difficulty and thus the fabrication cost, and also increases the parasitic capacitances and cross-talk between feed-through paths.

U.S. Pat. No. 6,528,344 discloses another way of forming vertical feed-throughs by use of a cap of silicon. Deep trenches are etched on the silicon cap wafer (only those silicon areas for feed-throughs are not etched), filled with dielectric material, and formed recess of dielectric material for cap gap. After bonding this wafer and the MEMS wafer, contact pads/electrodes of MEMS devices are connected to the silicon islands. Then the cap silicon side of the bonded stack is thinned down to reach or exceed the dielectric materials from the bottom side, so that the silicon islands are exposed and ready for further process to make interconnection. This approach uses silicon as part of the feed-through material and thus a relatively large series resistance is expected. Some of the required process steps, like the dielectric filling, polishing and recessing, and final dielectric membrane releasing, etc., increases the process difficulty and may lead to a stress issue.

In most of the disclosed approaches, vias are solidly filled with metal(s) as feed-through paths. This might cause thermal stress issue due to the large thermal mismatch between substrate and metal(s) and hence device reliability issue.

DETAILED DESCRIPTION OF THE PREFERRED EMBODIMENTS

An objective of this invention is to assemble MEMS or electronic devices/integrated circuits (ICs) in a wafer-level package format. The package can be optionally hermetically sealed by use of bonding techniques like anodic bonding, thermal compression bonding, glass frit bonding or eutectic bonding. All the interconnections are led out through vertical vias on one side of the bonded wafer stack in order to shorten the path of the feed-through; hence the feed-through resistance is minimized. Electric isolation between feed-throughs is formed on bulk material like glass or dielectric-coated-silicon, and thus the capacitive coupling can also be minimized. As a result, minimized feed-through resistance and coupling capacitance can be obtained at the same time.

Another objective of this invention is to package the devices/structures with a controllable cap gap between one of the device/structure surfaces and the cap electrode. This is important for MEMS structures since additional control flexibility is introduced which will result in improved performance and reliability. By way of example, a controlled cap gap may be used to provide motion limits (mechanical stops) and/or electrostatic drivers for imparting motion to a MEMS device.

Still another objective of this invention is to form a mechanical structure with minimized thermal-stresses due to thermal expansion mismatch between substrate and the filled metal(s)/alloy. As metals usually have much higher thermal expansion than silicon or glass, vias filled with solid metal plug/stud may encounter very high thermal stress problems or even changing surface height/roughness on top of the via, which will cause a variable top surface and thus non-stable performance.

Figure 1A:
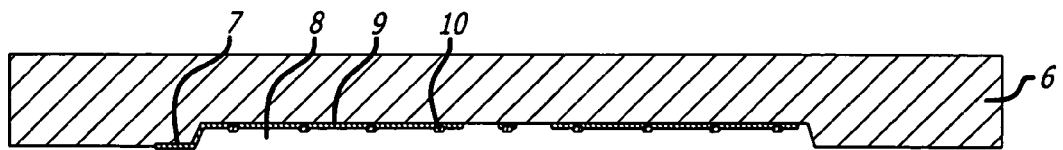
FIGS. 1a through 1f illustrate one embodiment of the present invention.
Figure 1B:
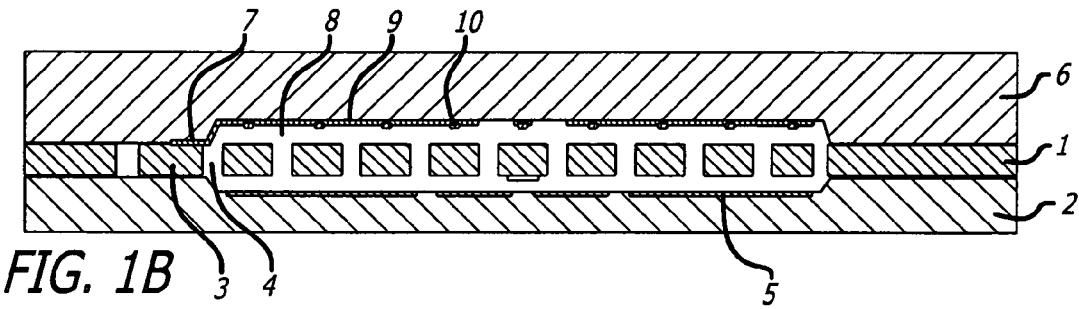

A first embodiment of the invented wafer level package fabrication process is illustrated in FIGS. 1a through 1f. The DEVICE 1 to be packaged may be a MEMS device, an integrated circuit or some other device, hereafter simply a DEVICE, normally of silicon, mounted on a substrate 2 (e.g., in this embodiment, glass), as shown in FIG. 1a. The electrically conductive regions to lead outs 5 can be, by way of example, doped silicon, metal, an alloy layer or stack on substrate 2 or DEVICE 1 or both, or a combination of such materials. As shown in FIG. 1b, the outer surface of DEVICE 1 can be bonded with another glass cap wafer 6. The bonding surface can be formed by either a fine polishing after thinning (e.g., grinding, milling or etching) of the DEVICE layer 1, or an etch stop layer buried in the original DEVICE substrate, or a fine control of the DEVICE layer thinning process, or just planar processes on substrate 2. Isolated conductive island 3 is formed by a DEVICE layer etch process where through trenches 4 on DEVICE layer are formed. Another starting material is a cap wafer with cavity 8 and optional conductive layer 9 on it. Optional DEVICE structures/layers can also be attached to the recessed side of the cap wafer 6 (not shown in the Figures). Optional dielectric bumps (or non-conductive regions) 10 can be deposited on top of the conductive layer 9 to prevent stiction during processing or operation of a MEMS device. The conductive layer 9 in the cavity 8 of this embodiment has an extension region 7 that is outside the cavity (or an un-recessed region in the cavity). As shall subsequently be seen, the extension region 7 provides a means of leading the cap electrode out in the wafer level package.

In any event, for this embodiment, the first step is to bond the two starting materials, DEVICE 1 on substrate 2, and cap 6, together by anodic bonding or other hermetic bonding such as thermal compression bonding (metal-metal bonding, which needs both side metal-coated and patterned) or eutectic bonding (one surface metal-coated and patterned). Anodic bonding is highly preferred as a reliable, high quality and reproducible technique. The gap between the capping wafer 6 and DEVICE 1 can be well defined (FIG. 1b) using conventional techniques.

Figure 1C:
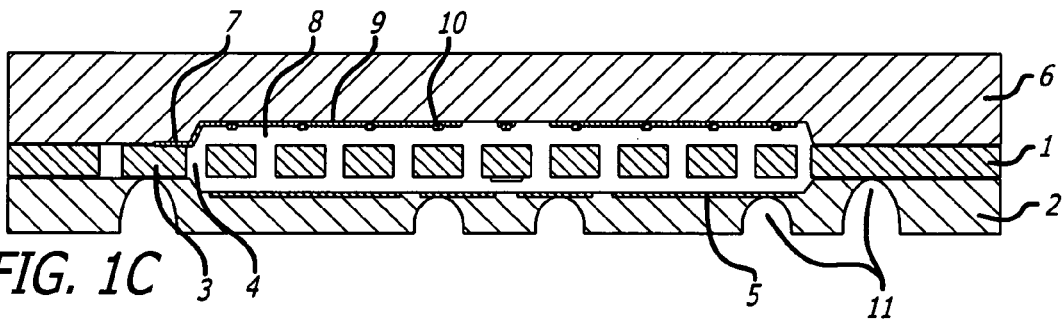
Figure 1D:
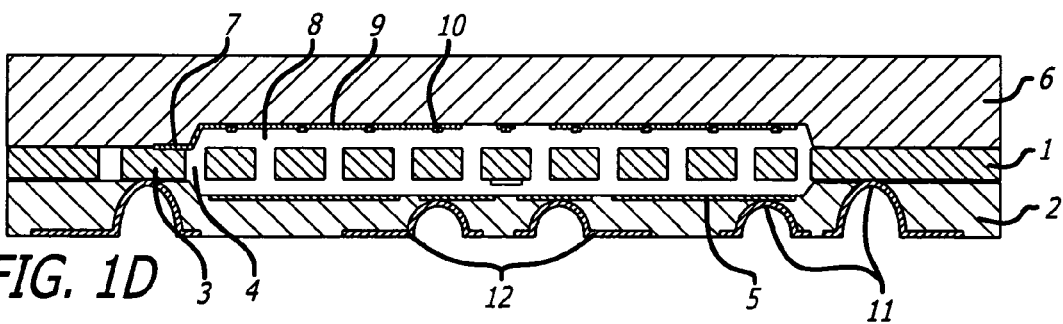

In the second step, the substrate 2 is thinned down to a preferred thickness by etching, milling or grinding and polishing the surface. On the thinned surface, via 11 is formed either by patterning and etching a masking layer followed by a via wet etching, dry etching, drilling, ultrasonic milling, laser drilling, sand blasting, water jetting, deep etch, or by other mechanical/laser drilling means, or by a combined method. Via etch can be stopped simultaneously on conductive DEVICE layer 3 and the conductive layer 5 on substrate 2. After via etch, the masking layer is removed, and the vias can be optionally fine-tuned by an additional etch to ensure good yield (FIG. 1c).

The next step is to make electrical interconnections by leading the conductive regions 5 electrically connected to the DEVICE structure to an outer surface of the bonded stack. At least two options can be used here. The first option is to plate metal(s) 12 through patterned photo-resist on top of a seed conductive layer, then to strip the photo-resist and seed layer after plating. The second option is to deposit, pattern and etch the conductive metal layer(s) 12. After this step, the major wafer level package process is completed (FIG. 1d) and the device can be packaged as normal integrated circuit (IC) chips after dicing the wafer.

Figure 1E:
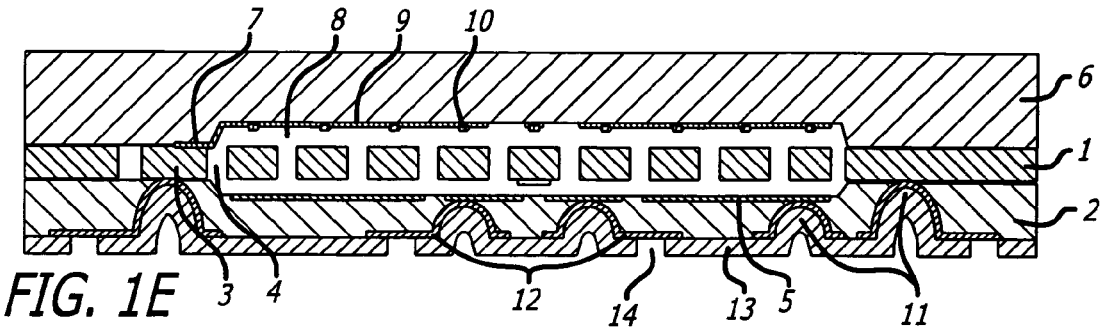
Figure 1F:
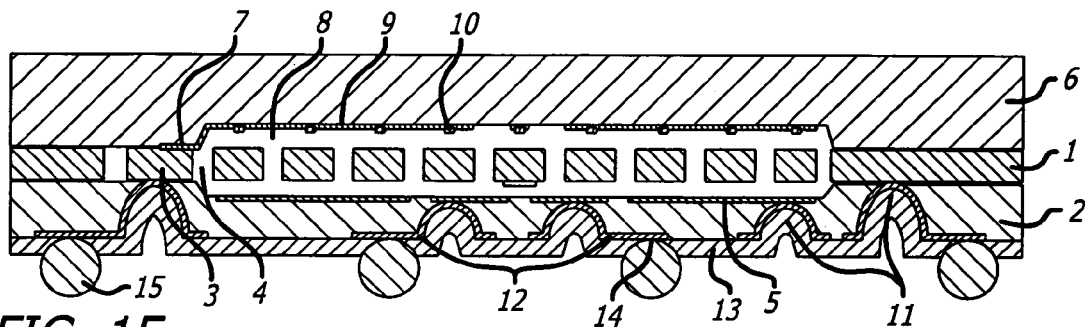

Moreover, the wafer can be further processed after this step for flip-chip assembly or as a surface mountable device (SMD). Solder bumping on wafer is one of the ways to achieve this. First, a dielectric passivation layer 13 is coated on substrate 2 and patterned to form contact openings 14 on top of the conductive metal(s) 12 (FIG. 1e). Then, solder joints can be formed by either plating through a patterned photo-resist or screen printing through a stencil mask. A final stripping of seed layers and (or) photo-resist followed by a solder re-flow will complete the whole process (FIG. 1f).

Figure 6:
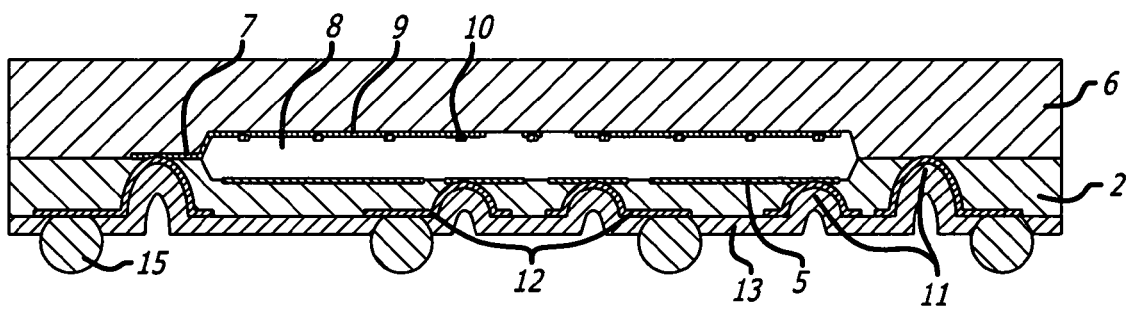
FIG. 6 illustrates a further embodiment of the present invention.

Optionally, the substrate wafer 2 only, with conductive regions 5 on one of its surfaces (without the extra stacked height of DEVICE 1 on top) can be bonded with a cap wafer 6 (as shown in FIG. 6), followed by the same process as described above. The optional cap electrode 9 is led out to part of the bond areas 7 and a via formed there provides a feed-through of cap electrode 9 to the final interconnection surface.

A second embodiment of this invention is schematically shown in FIGS. 2a through 2e. The major difference between the second embodiment and the first embodiment is the cavity depth in the cap wafer 26. Since in this embodiment, cap wafer 26 needs to bond to substrate 2 in the field areas below the top-most surface of DEVICE layer 1 on the substrate wafer 2, some variations have to be made. First, at least part of the field areas (including the surrounding areas for bond) on DEVICE structure 1 on substrate 2 must be bondable. This also needs the second adjustment, i.e., cap wafer cavity depth must be oversized to ensure a preferred final cap gap. Another adjustment on the DEVICE layer 1 is that there is no isolated conductive DEVICE layer island 3 for cap electrode interconnection. Instead, a bulk cap region 23 for the same purpose can easily implement this. Of course, a conductive layer like conductive layer 9 on the cap wafer 6 of the prior embodiment is not necessary if the cap wafer 26 is conductive, like silicon.

In this embodiment, the starting materials are DEVICE layer 1 on substrate wafer 2 and the cap wafer 26. Cap wafer 26 has recessed cavity 27 and optional dielectric bump region 28 on the bottom of the cavity 27. As another option other than dielectric bumps 28, the top surface of the cap wafer to be bonded to DEVICE wafer can also be globally dielectric coated.

Figure 2A:
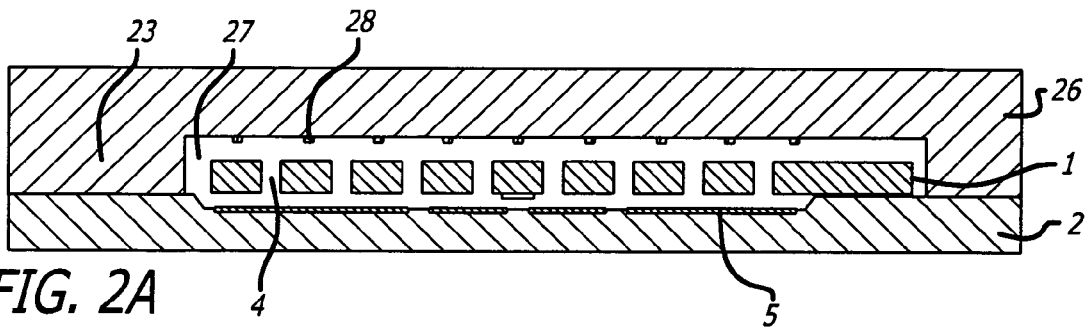
FIGS. 2a through 2e illustrate another embodiment of the present invention.
Figure 2B:
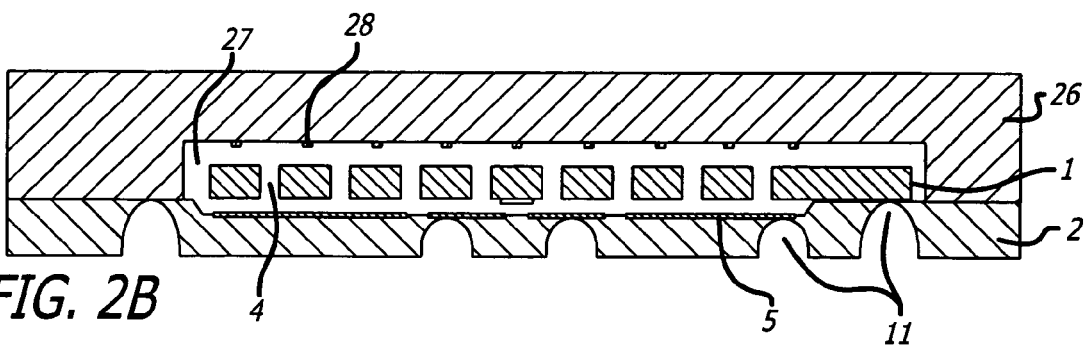
Figure 2C:
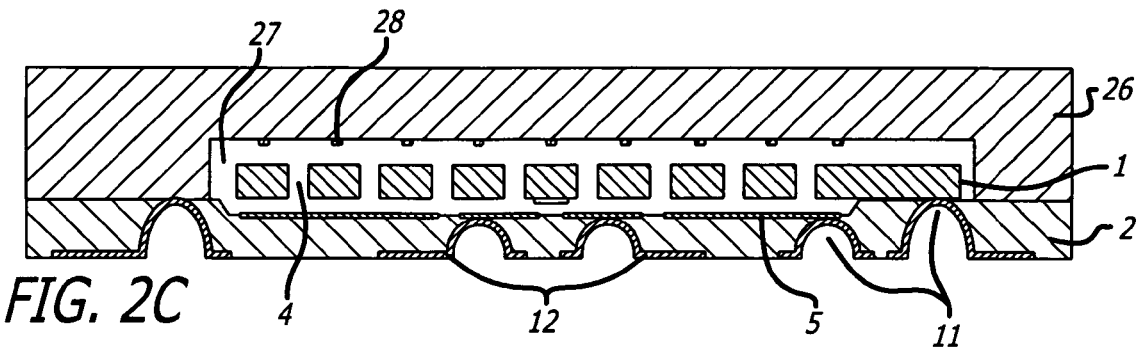
Figure 2D:
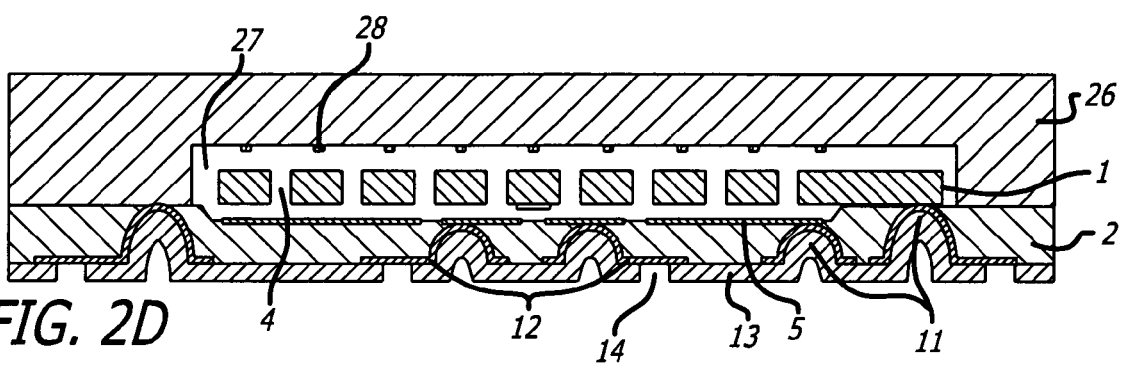
Figure 2E:
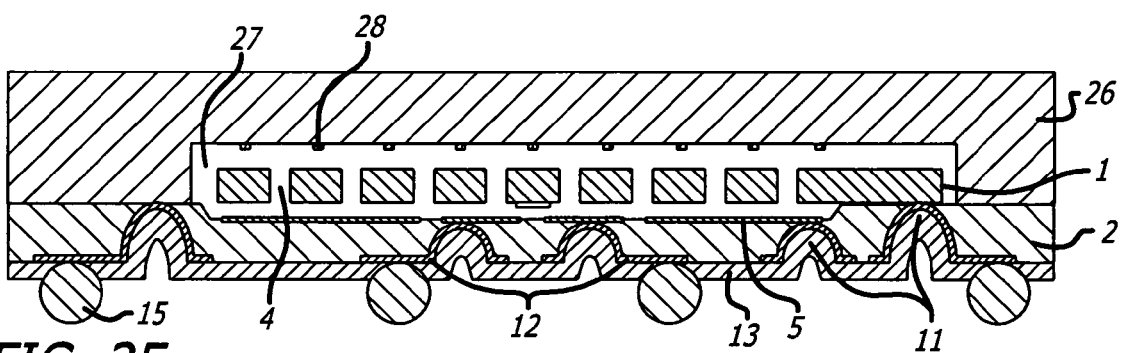

The fabrication steps are similar to that used in the first embodiment. The process starts with the bonding of the two starting materials (FIG. 2a), followed by substrate 2 (e.g., glass) thinning and via 11 forming (FIG. 2b). The bonding techniques used here include anodic bond, frit glass bond, thermal compression bond, eutectic bond or polymer bond. Then metal(s) patterning 12 for lead-outs is performed on the via-formed side of substrate 2 (FIG. 2c). The bonded wafer stack can also use solder-bumping by dielectric passivation 13, opening contacts for soldering 14 (FIG. 2d), and finally, solder bumping 15 (FIG. 2e).

Figure 3A:
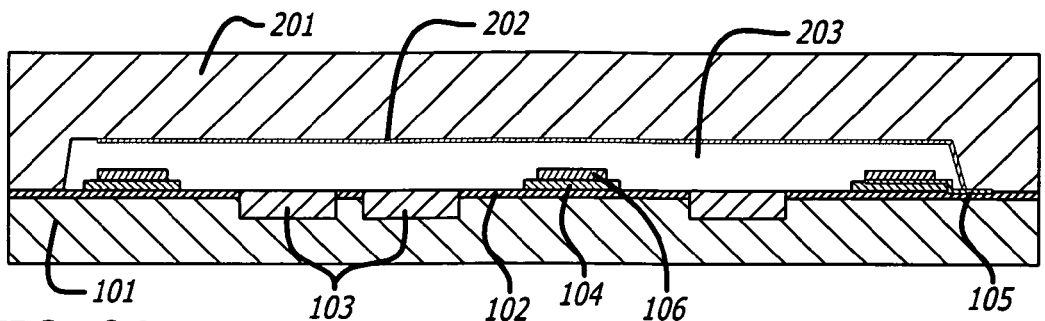
FIGS. 3a through 3h illustrate still another embodiment of the present invention.

A third embodiment of this invention is illustrated in FIGS. 3a through 3h. In FIG. 3a, a DEVICE wafer 101 bonded with a cap wafer 201 with a cap gap 203 is the starting material (FIG. 3a). On DEVICE wafer 101, metal pads 106 are located on top of an optional dielectric layer 104 as usual. DEVICE structure 103 and optional passivation layer 102 are on top side of the wafer. Optional thin metal feed-through 105 is led out to the bonding interface where optional cap electrode 202 is led to and electric connection is made by press-on bonding of metals. A DEVICE wafer 101 backside thinning is optionally performed prior to via processing.

Figure 3B:
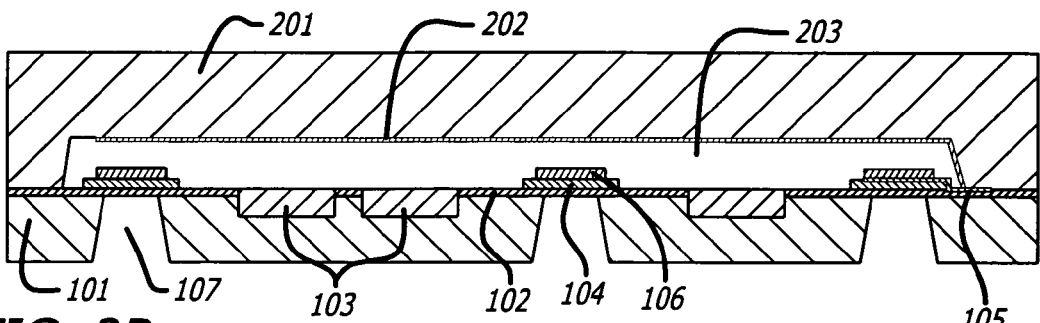
Figure 3C:
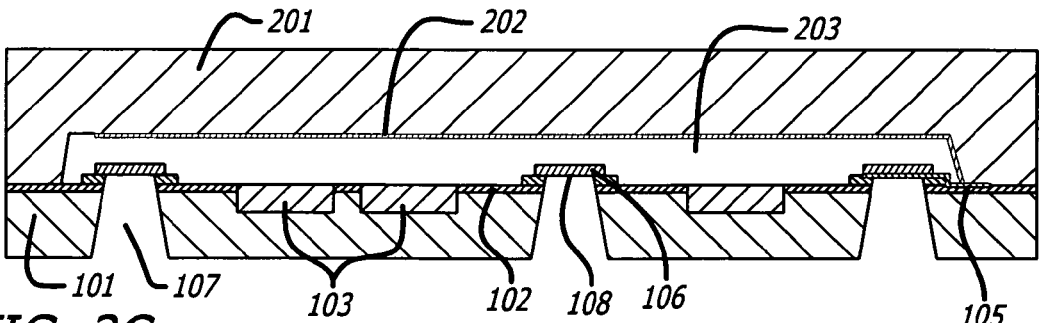
Figure 3D:
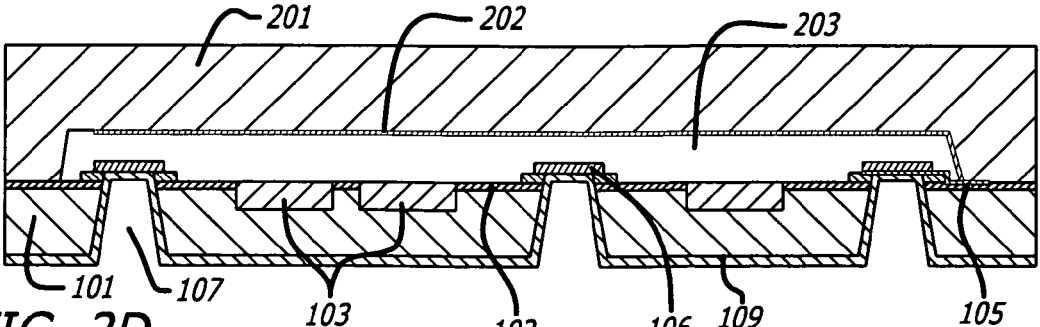

The via process starts with backside holes 107 formed in the DEVICE substrate wafer as shown in FIG. 3b. If DEVICE wafer 101 is silicon, this can be done by a masked etch including deep reactive ion etch (DRIE) or an anisotropic etch (e.g., KOH or TMAH etch). In the case of a glass DEVICE wafer 101, this can be a combined process of etch/drill/mill/water jet/sand blast. After that, the passivation layer 102 and dielectric layer 104 below the metal pads 106 and thin metal pad 105 are etched away to open the contact windows 108 from the bottom side of the metal pads 106 (FIG. 3c). This step can also be shifted to a later step where final contact window 110 is opened (see FIG. 3e).

Figure 3E:
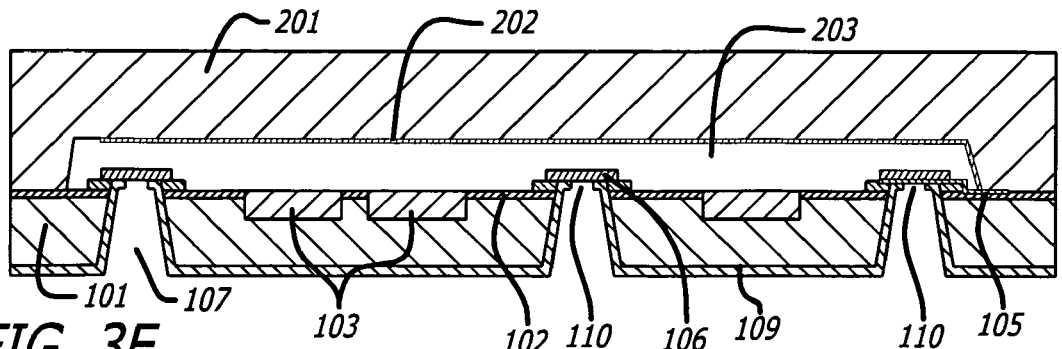
Figure 3F:
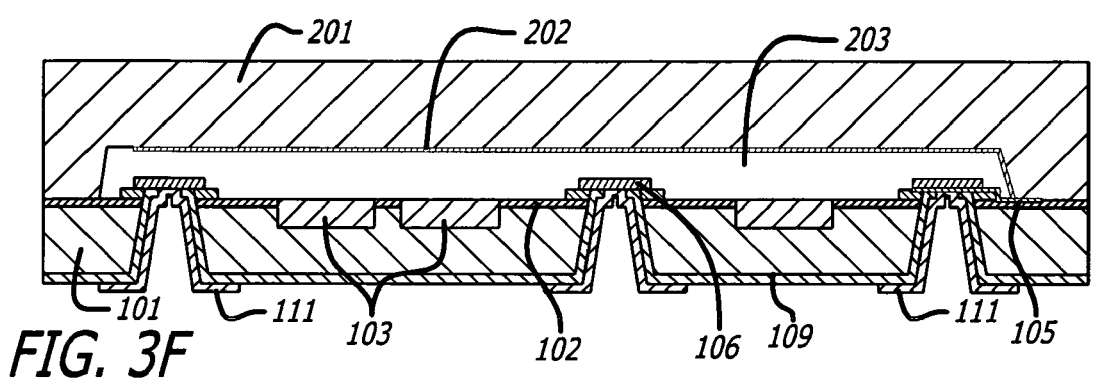

The next step is a conformal deposition of dielectric layer 109 on the backside of the DEVICE wafer (FIG. 3d), followed by a patterned etch to open the metal contact window 110 (FIG. 3e). Then a thick metal stack 111 is deposited and patterned for the final interconnection on the backside of DEVICE wafer 101 (FIG. 3f). Similar to the first embodiment, this can complete the wafer process, or continue to a further solder bumping process.

Figure 3G:
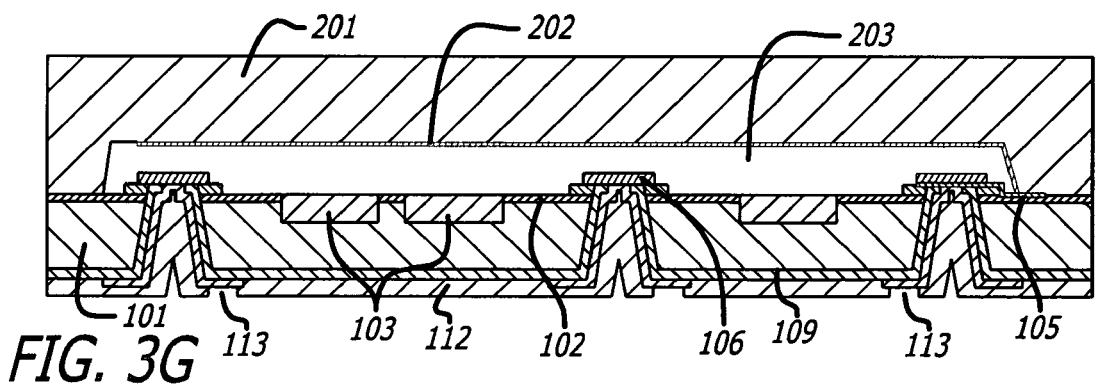

In the solder bumping process, a dielectric layer 112 (e.g., BCB) is first coated on the backside of DEVICE wafer 101, followed by a patterning of the contact opening 113 (FIG. 3g). Finally the solder bumps 114 are formed on top of the contact openings 113 using the same process as described in the first embodiment.

Figure 3H:
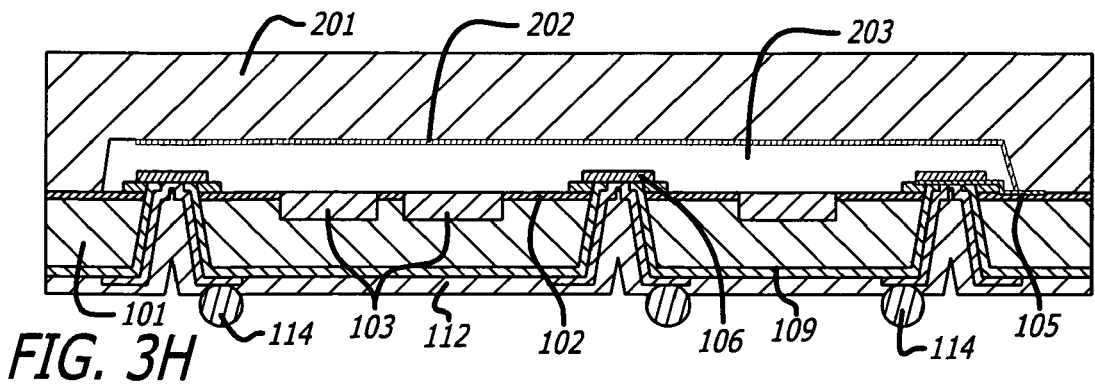
Figure 3I:
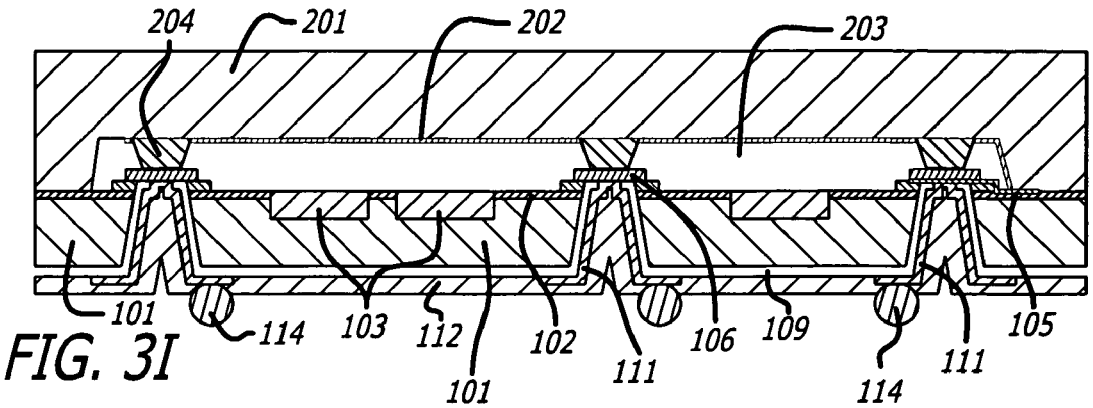
FIGS. 3i through 3k illustrate variations of the present invention.
Figure 3J:
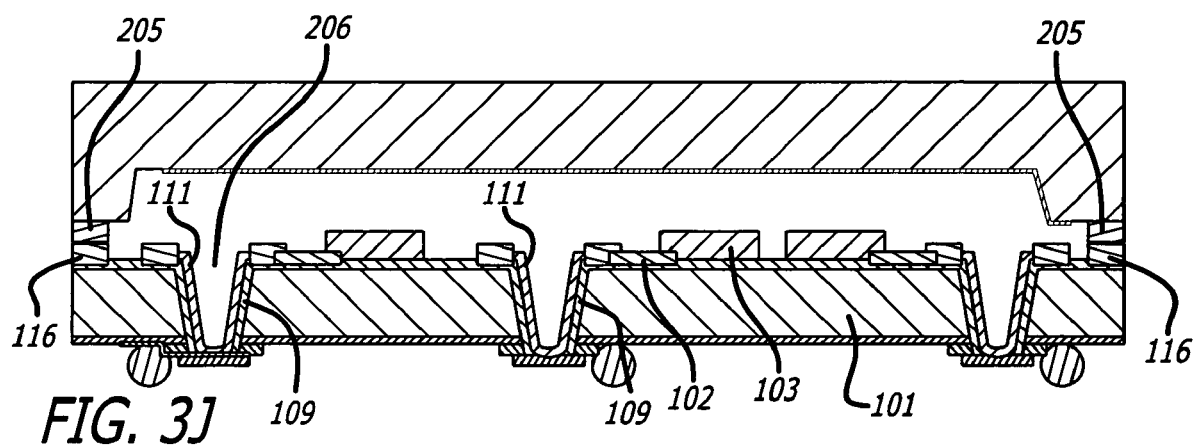
Figure 3K:
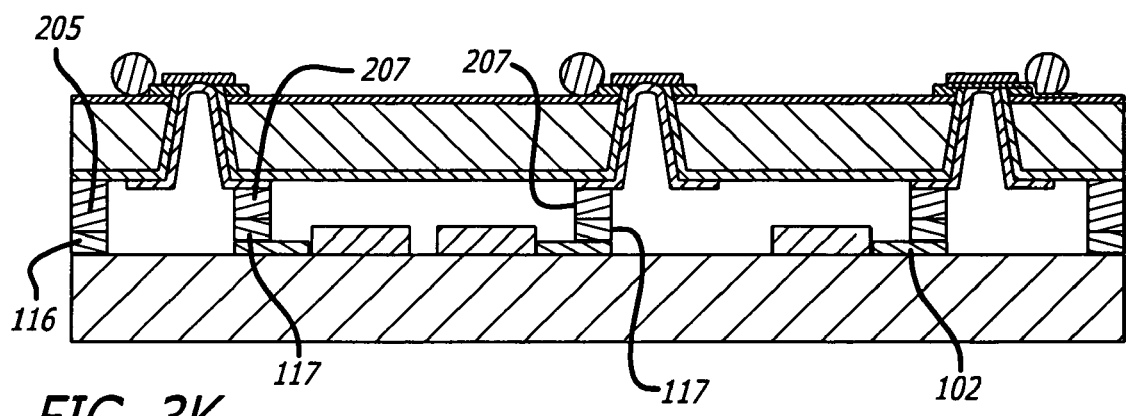

A few other important variations of the wafer level capping and hermetic feed through processes are show in FIG. 3i, FIG. 3j and FIG. 3k.

FIG. 3i shows a variation of the design in FIG. 3h. The via metallization 106 between the cap 201 and the device wafer 103 is reinforced by pillars 204 defined in the cap wafer. These pillars also bond to the top of the via metallization 106, thus providing a rigid support area to thin metal after it is exposed from the bottom. This allows for high yield without the via metallization breaking after via etch.

FIG. 3j shows a further variation of the design and process, where vias are initially etched into the device wafer 101 from the device side to the required depth. The vias are then coated with a thick insulating film 109, metallized (111) and connected to the device lead outs. The device wafer 101 is then bonded to a cap layer 201 by one of the several well known wafer bonding techniques (sealing material 116, 205, which can be metal, glass frit, etc.). The backside of the device wafer is then thinned as before to expose the via oxide liner and the metallization without punching through the via. This can either be done by choosing a thick oxide and via metal to allow for thinning non uniformity or by stopping wafer thinning a few microns before vias are exposed. A second via etch from the thinned side will expose metallization in the via for access to rerouting and solder bumping. This is followed by a standard solder bumping process, rerouting exposed via metallization to solder bumps. This process avoids selective patterning and etching of via liner oxide described with respect to FIG. 5 and needed for many of the bottom via designs.

Figure 4A:
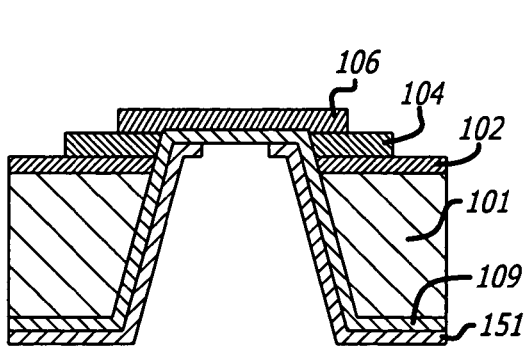
FIGS. 4a, 4b, 5a and 5b illustrate some details of the processing for opening the bottom of the metal pads inside the vias.
Figure 4B:
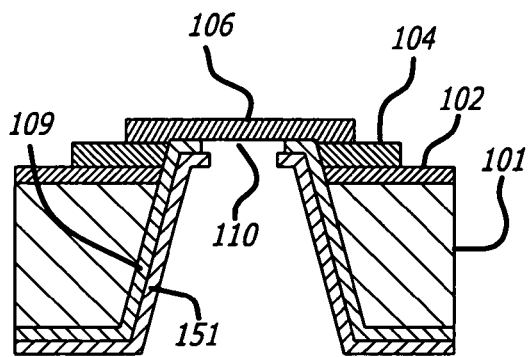
Figure 5A:
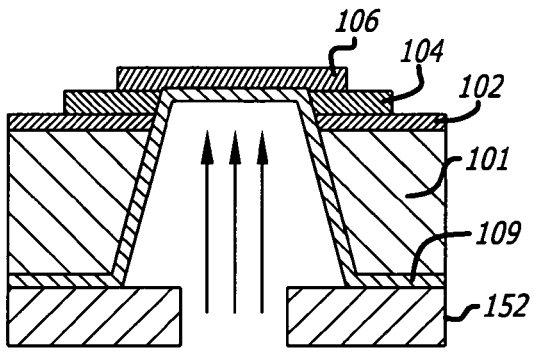
Figure 5B:
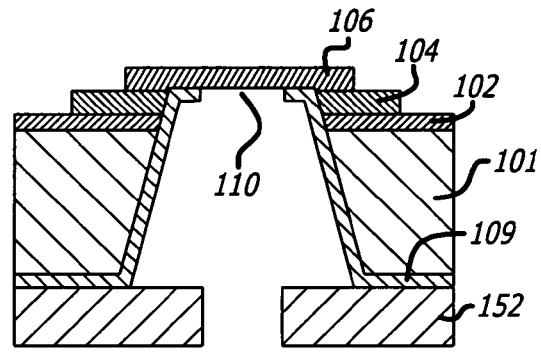

Some details of the processing for opening the bottom of the metal pads inside the vias are shown in FIG. 4 and FIG. 5. In FIG. 4, a photo-resist 151 is coated (spin-coat or spray-coat), followed by normal lithography steps (exposure and development). In the case where the via opening is shallow and wide (low aspect ratio), the bottom opening on resist 151 can be easily achieved for a reasonable sized window (e.g., 50-100 um), and this size is usually not very critical. The dielectric layer 109 below the metal pads 106 can be etched away with this photo-resist mask 151 or combined with a patterned hard mask underneath. If the via opening is deep and narrow (high aspect ratio), where opening on the deep bottom of a window by lithography seems impossible, another way of opening metal pads from the bottom is provided in FIG. 5. A free-standing mask 152, e.g., laminated dry film with opening patterns free-hanging or a shadow mask aligned to the DEVICE wafer, is used as the mask for an anisotropic etch (e.g., reactive ion etch RIE or ion milling, etc) of the dielectric layer 109 below the metal pads 106.

A different approach to the capping and via lead out process is to form vias and lead outs on the cap side after bonding as in FIG. 3k. In this case, the cap wafer needs to be optimally thinned, followed by via and interconnection processes. The sealing metals 116, 205 (gold, solder, Cu Au/Sn, Cu/Sn) also connect to the device lead outs 117, 207. These connections are lead out through a previously etched via in the capping wafer 101. The key feature is that the via is not an open hole leading through the cap wafer. The sealing metal also covers the bottom and side walls of the via such that the via is hermetically sealed. This enables the connection points to the device to be small without worrying about sealing around the perimeter of every connection pad. Also the via does not need to be filled with metal, saving on cost. The rest of the processes are similar to making contact to the via bottom metal as in FIG. 3j.

In the various embodiments of the present invention, the wafer size will typically range from 2 inches to 12 inches in diameter, and possibly larger. The thinning process will typically remove anything from 0 to 900 μm in wafer thickness. Each wafer will typically have a thickness in a range of 150 μm to 1 mm, with the cavity in the cap wafer typically being in the range of 0 to 200 μm.

Common overriding features of all of these processes/designs include:

1. A hollow via, closed at the bottom with only an insulator (needed for semiconducting substrates only) and metallization coated on via side walls and bottom.
2. Hermetic seal by any of various bonding/sealing techniques.
3. Hermetic seal in vias preserved by continuous closed metal at the bottom of the vias.
4. Small foot print of via metal on device side so as not to waste device area.

Embodiments of the present invention wafer level packaging technique has been used to package MEMS RF-relays. In such devices, the metallized region in the cap wafer forms a functional part of the relay in that it forms one electrode for electrostatic actuation of the relay. Both wire-bonded and solder-bumped devices have been tested with positive results. The hermetically sealed devices have shown very good performance in stability and reliability. RF performance is also improved as a result of the very low-parasitic structure. Well defined cap gaps and cap electrodes have improved RF isolation, breakdown voltage, stability and reliability of the RF-relay. The feed-through of a single via coated with Cu has resulted in a reproducible resistance of less than 8 m$\Omega$. Thermal cycling and life-time have been performed, also with very promising results. Some of the specifications achieved so far include:

Switching DC current (cold switch)>500 mA×2 hrs
Switching AC current (hot switch)>100 mA-10V-(4~13) million cycles
Ron 0.2~0.3$\Omega$ (or 0.4~0.6$\Omega$: depending on metal thickness) (leads+contact)
Switch time (on & off)<(70~120) us
Roff>>100 G $\Omega$ (0-200 V)
Contact breakdown>250 V (<1 μA)
Actuating voltage 60 V
Actuating power<200 μWatt
Life time (cold)>1 billion cycles (@ 1 kHz)
Life time (hot 10 mA-10V-1 kHz)>(450-1200) million cycles
Temperature coefficient of resistivity TCRon<0.16%/K (20° C.~100° C.)
Temperature coefficient of switch time<0.07%/K (20° C.~100° C.)
RF insertion loss~0.2 dB @2 GHz
RF isolation>38 dB @2 GHz Device size 3×3×0.66 mm^3 (SMD: surface mountable device)

The advantages of the present invention over the prior art includes:

1. Via process performed on a rigid wafer stack ensures a better yield and manufacturability, particularly on a large wafer format of more than 4 or 6-inch diameter.

2. Vias are not completely filled with metal(s). Thus thermal stress/reliability issues can be minimized.

3. The gap between the conductive layer on the inside of the cap wafer and silicon top surface can be well defined. This introduces a flexibility of operating a MEMS structure from the top-side (cap side) and can improve performance of a MEMS device.

4. Wafer level package ensures small package size and low cost production/package.

5. The direct vertical via through bulk dielectric substrate shortens the lead path and thus guarantees very low parasitic capacitance between any two of the lead-out electrodes. At the same time, the shortened lead path also provides a very low resistance feed-through.

6. Higher breakdown voltage and lower parasitic can be obtained with glass substrate than others like silicon or ceramics, and hence better RF performance.

7. Wafer level bumping process can be used.

The present invention is unique in providing vertical via for feed-through formed after bonding of the wafer stack, thereby providing a robust wafer process. The vias are partially filled with metal(s), thereby reducing thermal stress and improving reliability. The present invention also provides a well defined cap gap in a hermetic package, thereby providing increased control flexibility.

While certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A wafer level packaging process comprising:
   bonding a cap wafer over devices on a first side of a wafer size substrate, the substrate having a plurality of conductive regions on the first side thereof in electrical contact with the devices;
   forming vias through the substrate from a second side of the substrate to expose the conductive regions;
   covering each via from the second side of the substrate with a patterned metal layer, each part of the pattern being in electrical contact with a respective conductive region through a respective via;
   depositing a dielectric layer over the patterned metal layer;
   patterning the dielectric layer to expose part of the patterned metal layer in a region offset from the respective via; and,
   dicing the wafer level package.

2. The process of claim 1 wherein the conductive regions are selected from the group consisting of silicon, metals and alloys.

3. The process of claim 1 wherein the bonding is selected from the group consisting of anodic bonding, thermal compression bonding, eutectic bonding, glass frit bonding and polymer bonding.

4. The process of claim 1 wherein the bonding creates a hermetic seal.

5. The process of claim 1 wherein the vias are formed by one or more processes selected from the group of processes consisting of wet etching, dry etching, drilling, ultrasonic milling, laser drilling, sand blasting, water jetting, deep etch, mechanical drilling and laser drilling.

6. The process of claim 1 further comprised of solder bumping the exposed parts of the patterned metal layer before dicing the wafer.

7. The process of claim 1 wherein the substrate is silicon and further comprising coating and patterning a dielectric passivation layer over the second side of the substrate before covering each via with the patterned metal layer.

8. The process of claim 1 wherein the substrate is glass.

9. The process of claim 1 wherein the substrate is thinned before the vias are formed.

10. The process of claim 9 wherein the substrate is thinned by one or more processes selected from the group consisting of etching, milling, grinding and polishing.

11. The process as in claim 9 wherein the thinning takes away a wafer thickness of 0 to 900 μm.

12. The process of claim 1 wherein the wafer size substrate is a glass substrate and the devices are formed on a wafer scale silicon substrate bonded to the glass substrate.

13. The process of claim 12 wherein the cap wafer is bonded to the silicon substrate.

14. The process of claim 12 wherein the devices are separated by etching after the wafer scale silicon substrate is bonded to the glass substrate, and the cap wafer is bonded to the glass substrate in regions between devices.

15. The process of claim 12 wherein the devices are integrated circuits.

16. The process of claim 12 wherein the devices are MEMS devices.

17. The process of claim 16 wherein inside surfaces of the cap wafer form a functional part of the MEMS devices.

18. The process of claim 16 wherein the inside surfaces of the cap wafer include metal layers.

19. The process of claim 13 wherein the metal layers on the inside surfaces of the cap wafer include dielectric bumps to prevent a deflecting MEMS member from sticking to the metal layers on the inside surfaces of the cap wafer.

20. The process of claim 1 wherein the wafer size substrate is in the range of 2 inches in diameter to 12 inches in diameter.

21. The process as in claim 1 wherein the thickness of the MEMS/IC wafer and the cap wafer is in a range of 150 μm to 1 mm.

22. The process as in claim 1 wherein the cap wafer has cavities over the devices having a depth in the range of 0 to 200 μm.

23. The process of claim 1 wherein cap wafer includes pillars bonded to the conductive regions.

24. A wafer level packaging process comprising:
   providing a wafer size substrate with devices thereon;
   forming vias part way through a wafer size substrate from the device side of the wafer size substrate;
   forming a patterned metal layer over the partially formed vias with each metal layer portion over a respective via being electrically connected to a device;
   bonding a cap wafer over devices on the wafer size substrate;
   thinning the substrate to expose the metal layer in each via without disturbing the integrity of the metal layer; and,
   dicing the wafer level package.

25. The process of claim 24 further comprised of forming solder balls on the metal layer regions exposed in the thinning process.

26. The process of claim 25 further comprised of providing a patterned layer of metal over the metal layer regions exposed in the thinning process prior to forming the solder balls.

27. The process of claim 24 wherein the wafer size substrate is a silicon substrate and further comprising forming a dielectric layer over the substrate prior to forming a patterned metal layer over the partially formed vias.

28. The process of claim 24 wherein the devices are on the same wafer as the vias.

29. The process of claim 24 wherein the devices and the vias are on different wafers.

* * * * *